(12) United States Patent
Guillot et al.

(10) Patent No.: US 11,570,925 B2
(45) Date of Patent: Jan. 31, 2023

(54) ELECTRONIC DEVICE WITH INTEGRAL HOUSING

(71) Applicant: SAFRAN ELECTRONICS & DEFENSE, Paris (FR)

(72) Inventors: François Guillot, Moissy-Cramayel (FR); Marvin Doreau, Moissy-Cramayel (FR); Louis-Théophile Thirion, Moissy-Cramayel (FR)

(73) Assignee: SAFRAN ELECTRONICS & DEFENSE, Paris (FR)

( * ) Notice: Subject to any disclaimer, the term of this patent is extended or adjusted under 35 U.S.C. 154(b) by 0 days.

(21) Appl. No.: 17/766,064

(22) PCT Filed: Sep. 30, 2020

(86) PCT No.: PCT/EP2020/077297
§ 371 (c)(1),
(2) Date: Apr. 1, 2022

(87) PCT Pub. No.: WO2021/063986
PCT Pub. Date: Apr. 8, 2021

(65) Prior Publication Data
US 2022/0369491 A1    Nov. 17, 2022

(30) Foreign Application Priority Data
Oct. 2, 2019  (FR) ........................... 1910929

(51) Int. Cl.
*H05K 1/00* (2006.01)
*H05K 7/14* (2006.01)
*H01R 13/514* (2006.01)
*H01R 12/58* (2011.01)

(52) U.S. Cl.
CPC ......... *H05K 7/1452* (2013.01); *H01R 12/585* (2013.01); *H01R 13/514* (2013.01); *H05K 7/1417* (2013.01)

(58) Field of Classification Search
CPC .. H05K 7/1452; H05K 7/1417; H01R 12/585; H01R 13/514
USPC ....................................................... 361/752
See application file for complete search history.

(56) References Cited

U.S. PATENT DOCUMENTS

| 5,304,964 | A | * | 4/1994 | DiMarco | H01R 13/719 |
|---|---|---|---|---|---|
| | | | | | 333/182 |
| 5,348,482 | A | | 9/1994 | Rudy, Jr. | |
| 9,147,981 | B2 | * | 9/2015 | Oh | H01R 12/00 |

FOREIGN PATENT DOCUMENTS

| EP | 1437931 A2 | * | 7/2004 | ......... H01R 13/7197 |
|---|---|---|---|---|
| EP | 1437931 A2 | | 7/2004 | |
| EP | 2259386 A1 | | 12/2010 | |

* cited by examiner

*Primary Examiner* — Andargie M Aychillhum
(74) *Attorney, Agent, or Firm* — Muncy, Geissler, Olds & Lowe, P.C.

(57) ABSTRACT

A connection device includes a housing having a first face provided with a first opening that is closed by a PCB, and a second face provided with a second opening facing at least one electrical connection interface of the PCB. The housing includes at least one well extending from an edge of the second opening to the PCB so as to position a first connector relative to the connection interface, and in that the housing is a one-piece part that includes the well.

6 Claims, 3 Drawing Sheets

ELECTRONIC DEVICE WITH INTEGRAL HOUSING

BACKGROUND OF THE INVENTION

The present invention relates to the field of electrical connection, more particularly in the field of aviation.

Connection devices are known that comprise a housing having a peripheral frame with an edge defining a first opening that is closed by a printed circuit board (PCB) and an opposite edge having fitted thereto a plate with a second opening facing at least one electrical connection interface of the PCB. A well is secured on said plate so as to extend from an edge of the second opening to the PCB in order to receive one or more first connectors connected to the connection interface. The connection interface is generally constituted by plated-through holes (PTHs) formed in the PCB and connected to conductive tracks of said PCB. The first connector comprises a rigid body having one end provided with "press-fit" type pins for engaging in the PTHs and an opposite end arranged to cooperate with a corresponding second connector. The first connector is connected to the second connector by pins received by force in the PTHs.

By way of example, such connection devices are used in airplanes for connecting the computers of the airplane to the avionics harness in compliance with the ARINC 600 standard. These computers are grouped together in a chassis (or a bay or a rack-mount housing) having both an opening for installing computers, and also a backplane opposite the opening, which backplane carries the connection device in such a manner that a computer is connected to the connection device automatically by the computer being installed in the bay, the contacts of the computer being received in the connection device when the computer is in position in the chassis. These connection devices are commonly referred to as the backplane blocks of the rack-mount housing.

The design of the housing requires manufacturing clearances and assembly clearances that need to be mastered very precisely, since otherwise the pins of the first connector risk being offset so much relative to the PTHs that connection is prevented, particularly given that the density of the PTH-and-pin pairs is tending to increase.

OBJECT OF THE INVENTION

A particular object of the invention is to simplify connection devices of this type.

SUMMARY OF THE INVENTION

To this end, according invention, there is provided a connection device comprising a housing having a first face provided with a first opening that is closed by a PCB and a second face provided with a second opening facing at least one electrical connection interface of the PCB. The housing includes at least one well extending from an edge of the second opening to the PCB so as to position a first connector relative to the connection interface, and in that the housing is a one-piece part that includes the well.

Thus, the housing is a single piece such that the only clearances that need to be taken into account are manufacturing clearances, which are easier to master than assembly clearances. Also, the well can constitute means for guiding and positioning the first connector relative to the connection interface. The first connector can be simplified, since the well also contributes to the mechanical strength of the connection of the first connector both to the connection interface and also to a second connector complementary to the first.

Other characteristics and advantages of the invention appear on reading the following description of a particular and nonlimiting implementation of the invention.

BRIEF DESCRIPTION OF THE DRAWINGS

Reference is made to the accompanying drawings, in which.

DETAILED DESCRIPTION OF THE INVENTION

Figure 1:
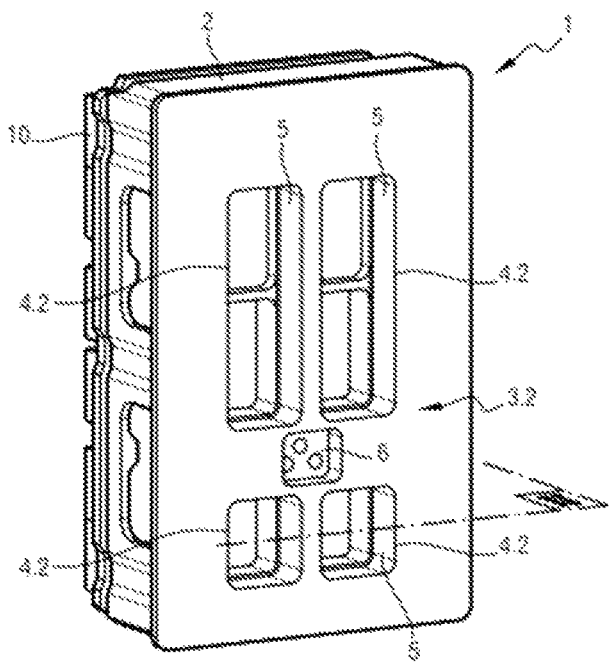
FIG. 1 is a perspective view of a connection device of the invention.
Figure 2:
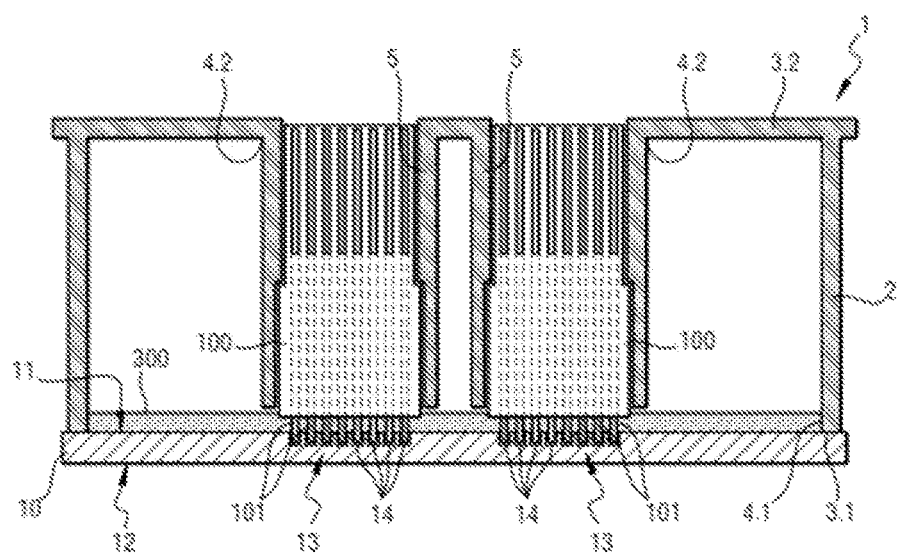
FIG. 2 is a diagrammatic view of the connection device in cross section on plane II of FIG. 1.
Figure 3:
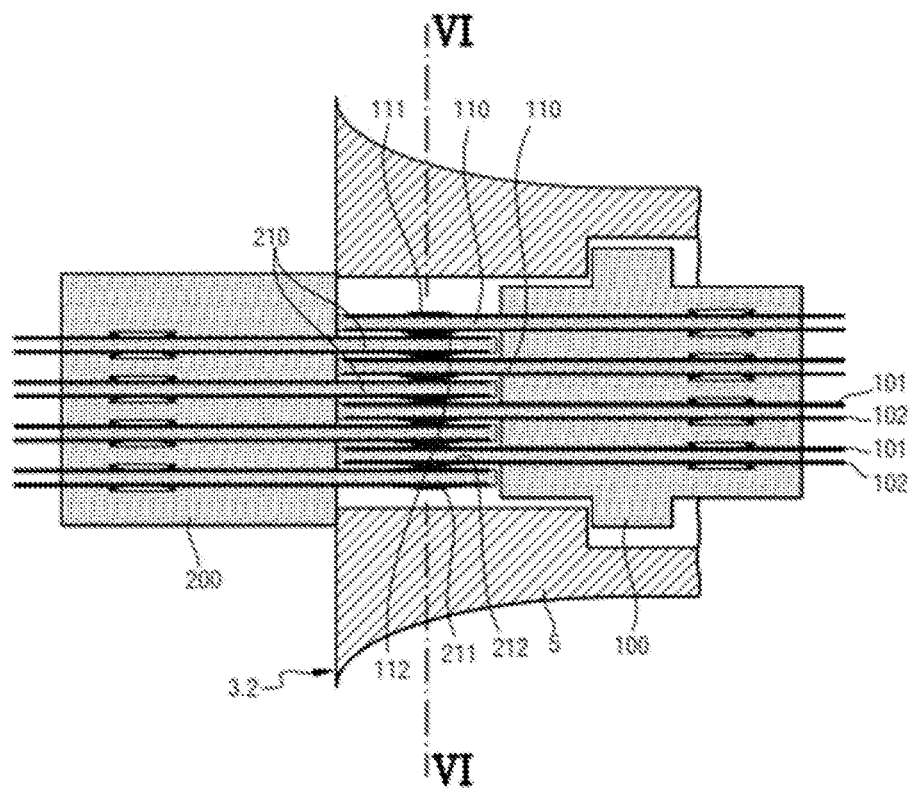
FIG. 3 is a fragmentary diagrammatic view in cross section on a plane perpendicular to the PCBs, showing two connectors connected together.
Figure 4:
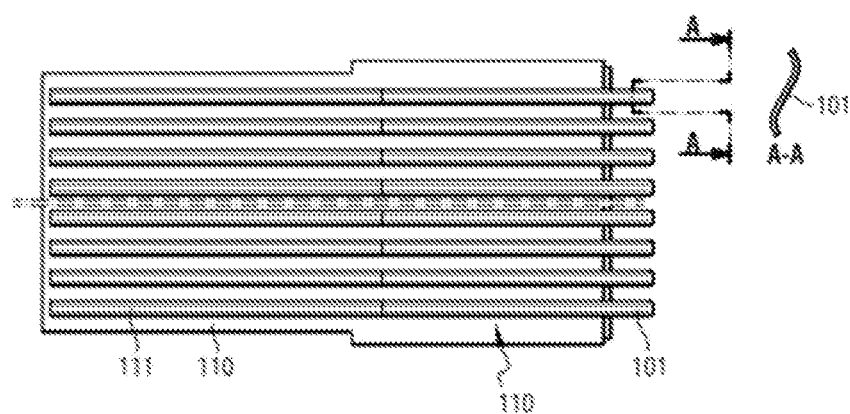
FIG. 4 is a front view of the first connector.
Figure 5:
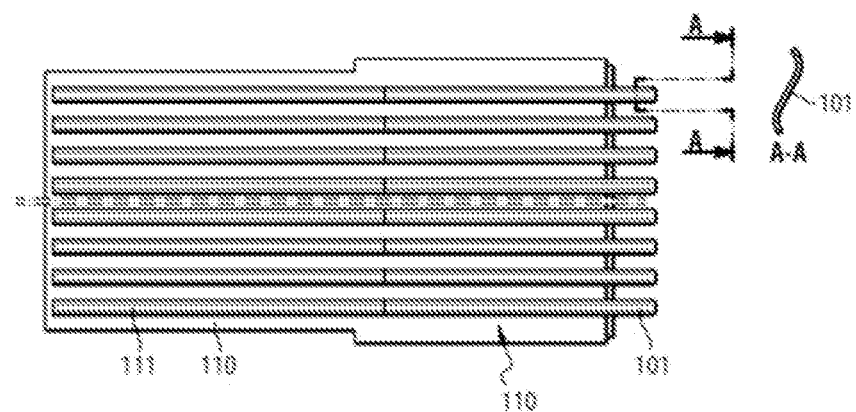
FIG. 5 is a diagrammatic view, in section on line V-V FIG. 4, showing the first connector.
Figure 6:
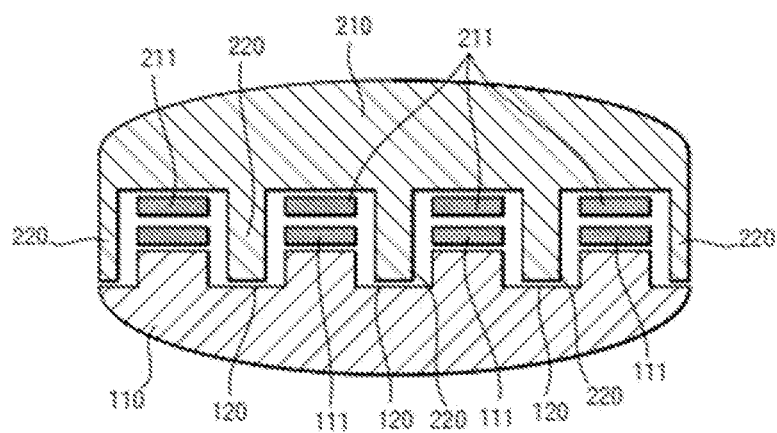
FIG. 6 is is a fragmentary diagrammatic view in section on line VI-VI of FIG. 3, showing two connectors connected together.

With reference to the figures, the connection device of the invention comprises a housing given overall reference 1 and a printed circuit board (PCB) 10.

The housing 1 is of rectangular box shape and it is defined by a side wall 2 of the closed outline with one free edge forming a first face 3.1 of the housing 1 and an opposite edge that is secured to a back wall forming a second face 3.2 of the housing 1. The side wall 2 forms a frame and it extends perpendicularly to the PCB 10. The first face 3.1 is provided with a first opening 4.1 (defined by the free edge of the side wall 2), and the second face 3.2 is provided with second openings 4.2.

The housing 1 includes wells 5, each extending from an edge of a respective one of the second openings 4.2 and each having a free edge that is set back a little from the plane of the first face 3.1. Each well 5 is defined by a side wall of closed outline projecting from the second phase 3.2 of the housing 1 and possessing a free end that is open, i.e. without an end wall. The outline is of substantially the same shape as the opening bordering the well, which opening may be of circular, rectangular, square, or other shape depending on the shape of the connector that is to pass through it, as described below.

The second face 3.2 is provided in conventional manner with a keying member 6 so as to prevent assembly and connection errors.

The housing 1 is of monolithic structure: the side wall 2, the faces 3.1 and 3.2, and the wells 5 comprise a single one-piece part. The housing is the result of machining a block of material, specifically a metal such as aluminum. Other manufacturing methods could be used. Thus, in variants, the housing could be the result of additive manufacturing or of molding. For the tightest manufacturing tolerances, it is possible to perform reworking, in particular for the first face 3.1 since it constitutes a reference for positioning the housing 1 relative to the PCB 10.

The free edge of the side wall 2 is applied against one of the faces 11 of the PCB 10, which PCB closes the first opening 3.1 and also possesses an opposite face 12. Said face 11 is provided with a connection interface 13 that is connected both to conductive tracks of the PCB 10 and also to a connection interface carried by the opposite face 12, and not shown herein.

The connection interface 13 extends facing the second opening 4.2 and it is surrounded by the free edge of the well 5. In this example, the connection interface 13 comprises plated-through holes (PTHs) 14.

Two of the wells 5 each receive a first connector 100 comprising a respective dialectic support with a first end provided with conductors 101, 102 of pin shape that project from the dialectic support and that are received by force in the PTHs 14. The wells 5 are arranged to guide and position the first connector 100 relative to the first connection interface 13. The conductors 101 of the first connector 100 present a cross-section in the shape of a flattened letter S. Opposite from the conductors 101, the dialectic support of the first connector 100 has first electrically insulating plates 110 that are parallel to one another, each having one face carrying first signal transport contacts 111 that are connected to the conductors 101, and an opposite face carrying a first shielding sheet 112 that is connected to the conductors 102.

Each first connector 100 forms part of an electrical connection assembly that also comprises a complementary second connector 200. Like the first connector 100, the second connector comprises a dielectric support including second electrically insulating plates 210 that are parallel to one another, each having one face carrying second signal transport contacts 211 and an opposite face carrying a second shielding sheet 212.

The contacts 111 and 211 are arranged in conductive tracks that extend parallel to a mutual engagement direction for connecting the connectors 100 and 200 together. The contacts 111 and 211 are in the form of stamped strips that are elastically deformable between a rest position in which the strip is spaced apart from the conductive track, and a deformed position in which the strip is level with the conductive track.

The shielding sheets 112 and 212 also have contacts that are formed by strips cut out in the shielding sheets 112 and 212 and that are elastically deformable between a rest position in which the strip is spaced apart from the shielding sheet 112 or 212 and a deformed position in which the strip is level with the shielding sheet 112 or 212.

The contacts 111 and the shielding sheets 112 have positions that are inverted relative to the contacts 211 and the shielding sheets 212 in such a manner that, when the first connector 100 is connected to the second connector 200, the plates 110 are interleaved between the plates 210, and vice versa, the first contacts 111 are pressed against the second contacts 211, and the first shielding sheets 112 are pressed against the second shielding sheets 212. The contacts 111 and 211 are narrow flat contacts for transporting signals, and the shielding sheets 112 and 212 are wide flat contacts for constituting ground planes between zones of contacts. In this example, the contacts 111 and 211 and the shielding sheets 112 and 212 are all made by stamping the same type of metal sheet material, which enables contacts to be standardized for all types of signal. In this example, the width of the contacts 111 and 211 is determined so as to double contact density compared with a conventional ARINC 600 connector having standard 22 gauge contacts.

The plates 210 of the second connector 200 have splines 220, each extending between two contacts 211 parallel to the conductive tracks, and the plates 110 of the first connector 100 and have grooves 120 extending between two contacts 111 parallel to the conductive tracks so that each of them receives the free edge of a respective spline 220.

A layer 300 of electrically insulating material extends between the first surface of the first connector 100 and the connection interface as far as the free edge of the side wall 2, the conductors 101 of the first connector 100 passing through the layer 300. The layer 300 has thickness of about 0.6 millimeters (mm). The electrically insulating material is a room temperature vulcanizing (RTV) silicone.

When the second connector 200 is connected to the first connector 100, the plates 210 then extend, like the plates 110, in the wells 5, which protect them and protect the connection; the contacts of each facing pair of contacts 111 and 211 are pressed against each other; the shielding sheets of each facing pair of shielding sheets 112 and 212 are pressed against each other; the free edge of each spline 120 is received in the facing groove 220.

As a result of the monolithic construction of the housing 1, its tolerance intervals are relatively tight (a few tenths of a millimeter), thus enabling the positioning of the conductors of the first connectors 100 in the PCB to be more precise. This arrangement makes it possible to omit the body of the first connector 100, since the wall of the well 5 is positioned and dimensioned in a manner that is sufficiently precise for the housing 1 to be able to provide the mechanical strength functions that are normally provided by the connector body. Mechanical functions are thus shared between the housing and the connector.

The contacts of the first connector 100 and of the second connector 200 that face one another provide electrical coupling and capacitive coupling, without any significant break in the iterative impedance of the differential transmission line, thereby making possible a wide passband for digital buses (up to a few gigabits per second).

The arrangement of contacts in the first connector 100 and the second connector 200 thus makes it possible specifically to replace "Quadrax" type connectors while providing contact density that is greater and thus providing better capacity to transfer signals.

The shielding sheets 112 and 212 prevent capacitive coupling between equipotentials of one plate 110 or 210 and the other.

The splines 120 and the grooves 220 cooperate like interdigitated combs (thus forming baffle-type passages), and the electrically insulating material of the plates 110 and 210 is selected in such a manner that the dielectric distances between adjacent contacts are artificially increased and the dielectric strength of the plates 110 and 210 are much greater than the dielectric strength of air (in particular at low pressure). By way of example, the dimensions and the material of the combs are selected so as to allow a maximum direct current potential difference of 2100 volts (Vdc) between two adjacent contacts at altitude 0. For a 0.5 mm spline 120 engaged to a depth of 0.2 mm in the groove 220, the resulting insulation distance in air becomes 0.2 mm+0.5 mm+0.2 mm=0.9 mm. Taking account of the dielectric strength conventionally attributed to dry ambient air being equal to 3600 volts per millimeter (V/mm), the comb structure can withstand a potential difference of 0.9×3600 V=3240 V. For air of saturated humidity, which does not occur in ventilated airplane bays, the dielectric strength that is conventionally assumed is 1000 V/m, and the comb structure can withstand a potential difference of 0.9× 1000=900 V.

Since the dielectric distance in air between the conductors 110 is very small, and potentially too small to withstand aviation dielectric stresses, provision is made to add the layer 300, which is electrically insulating. The layer 300 is compressed between the first connector 100 and the PCB. The layer 300 is made of a material that is elastically deformable and that presents electrical insulation performance better than that of air.

The layer 300 is made on the basis of a very liquid RTV resin, and it is shaped as follows:
- at ambient pressure and temperature, the resin is applied to the top of the PCB 10 by passing through an opening in the side wall that is spaced apart from the PCB by a height that is greater than the thickness desired for the layer 300. The quantity of resin is defined so that the bottom of the dielectric support of the first connector 100 is immersed in the resin so as to guarantee continuity of electrical insulation. The thickness of the resin is about 0.6 mm, since the spacing between the bottom of the dielectric support and the top of the PCB is about 0.5 mm;
- the device is placed in a depressurization chamber (target 10 mBar) in order to guarantee that the resin penetrates into all of the gaps or holes in the PCB and in order to eliminate all of the bubbles that might be present in the resin. This ensures that, around the conductors 101 that are to be insulated from ambient air, the resin is uniform.

It should be observed that the housing 1 and the PCB form a mold for receiving the liquid resin. By way of example, the RTV resin used is a silicone resin, and in particular that sold under the reference "Snapsil TN3305" by the supplier Momentive. This silicone-based resin has viscosity of 47 and is usable in the range −55° C. to +125° C.

Preferably, in order to make the first conductor 100, the contacts 111 and the shielding sheets 112 are stamped (cut out and shaped) in a single cutting and forming operation, thereby also forming the conductors 101 (press-fit pins) and shapes in relief for anchoring this assembly in the dielectric support of the connector 100. Said dielectric support is made as two sub-portions in which the metal sheets and strips are mounted. At the junction point between the two sub-portions, the anchoring shapes in relief of the strips come into abutment. Thereafter, the two insulating sub-portions are preferably welded together by an ultrasonic welding technique that makes it possible, while performing thermoplastic welding, to ensure that heating is localized, thereby avoiding the use of an adhesive or of heating that is general, which could be a factor limiting the mechanical precision of the connector. The anchoring shapes in relief are of a size suitable for forming mechanical bonds that prevent any longitudinal movement of the conductors 101, in particular during press-fit operations.

Naturally, the invention is not limited to the embodiment described, but covers any variant coming within the field of the invention as defined by the claims.

In particular, the device may be of a structure that is different from that described.

In a variant, it is possible to make the wells so that they form sockets, each suitable for receiving a respective plug of a Quadrax type connector, thereby making it possible to further improve the precision with which the plugs of the Quadrax type connector are positioned and to reduce the number of mechanical parts that need to be made.

Although in this example the means enabling the electrical path from one contact to another comprise a comb structure, other means could be envisaged.

It is possible to use high speed contacts for transporting high currents: higher currents are made possible by connecting them in parallel, and this is done on the PCB.

It is possible to use first connectors of modular sizes by creating groups of small signal contacts that are associated with one another by their dielectric support and that are associated with the shielding sheet (or ground plane) mounted opposite from the small signal contacts. Each contact module (which would then resemble a plate 110 or 210 carrying the contacts 111 or 211 and the shielding sheet 112 or 212) is associated with another one, and so on, so as to create a first connector of desired size. The first connectors should be of constant width (the width of the plate 110 or 210), with variation being in height only.

The dielectric support may be made by injection molding a thermoplastic or thermosetting resin.

The invention is applicable to all ARINC 600 computers, and it may be extended to any other type of computer connector that have the same requirements, e.g. EN4165 connectors.

Using the housing as a lost mold is optional. Another solution would be to inject the same RTV resin locally while keeping it in the connector zone by means of local leakproof barriers (made with a second RTV resin that is more pasty).

The connectors may be of a structure that is different from that described, and for example it may be a conventional structure.

Using a layer of electrically insulating material is optional, and depends on the constraints of using the device.

The invention claimed is:

1. A connection device, comprising a housing having a first face provided with a first opening that is closed by a PCB and a second face provided with a second opening facing at least one electrical connection interface of the PCB, wherein the housing includes at least one well extending from an edge of the second opening and having a free end in the vicinity of the PCB so as to surround a first connector received in the well and position it relative to the connection interface, and in that the housing is a one-piece part that includes the well.

2. The device according to claim 1, wherein the housing is of rectangular box shape with a side wall forming a frame that extends perpendicularly to the PCB.

3. The device according to claim 1, wherein the second face is provided with a keying member.

4. The device according to claim 1, wherein the housing is the result of machining a block of material.

5. The device according to claim 1, wherein the housing is the result of additive manufacturing.

6. The device according to claim 1, wherein the housing is the result of molding.

* * * * *